United States Patent [19]

Rose et al.

[11] 4,353,038
[45] Oct. 5, 1982

[54] WIDEBAND, SYNTHESIZER SWITCHED ELEMENT VOLTAGE CONTROLLED OSCILLATOR

[75] Inventors: Richard A. Rose, Streamwood; James K. Gehrke, Palatine; Terrance J. Goedken, Roselle; Roger Vilmur, Palatine, all of Ill.

[73] Assignee: Motorola, Inc., Schaumburg, Ill.

[21] Appl. No.: 249,535

[22] Filed: Mar. 31, 1981

[51] Int. Cl.³ .............. H03B 5/12; H03B 5/18; H03C 3/22; H03L 7/16
[52] U.S. Cl. .................. 331/36 C; 331/25; 331/117 D; 331/177 V; 331/179; 332/16 T; 332/30 V
[58] Field of Search .......... 331/117 D, 117 R, 177 V, 331/179, 36 C, 117 FE, 25; 332/30 V, 16 T; 455/255, 258, 262, 264, 195–199

[56] References Cited

U.S. PATENT DOCUMENTS

| | | | |
|---|---|---|---|
| 3,319,187 | 5/1967 | Crandall | 331/117 D |
| 3,400,338 | 9/1968 | Ishman | 331/117 |
| 3,416,100 | 12/1968 | Kruse, Jr. et al. | 331/108 |
| 3,538,450 | 11/1970 | Andrea et al. | 331/179 X |
| 3,571,754 | 3/1971 | Healey et al. | 331/177 V X |
| 3,579,281 | 5/1971 | Kam et al. | 332/30 V |
| 3,614,665 | 10/1971 | Weller et al. | 331/101 |
| 3,668,553 | 6/1972 | Dunn et al. | 331/107 DP |
| 3,755,758 | 8/1973 | Leeson | 331/101 |
| 4,075,580 | 2/1978 | Sunkler | 331/96 |

Primary Examiner—Siegfried H. Grimm
Attorney, Agent, or Firm—Donald B. Southard; Edward M. Roney; James W. Gillman

[57] ABSTRACT

An exceptionally wideband, synthesizer controlled voltage controlled oscillator is disclosed which is characterized by a plurality of pin diode frequency shift networks which, when actuated shifts the frequency of the oscillator in selectable binary steps within a wide frequency range in the order of 48 MHz. Special means are included to prevent undesireable parasitic oscillation modes when such frequency shift networks are in an inactuated, switched off mode. A multiple varactor tuning circuit is provided for selecting a precise frequency within a relatively narrow frequency band on the order of 6 MHz.

10 Claims, 3 Drawing Figures

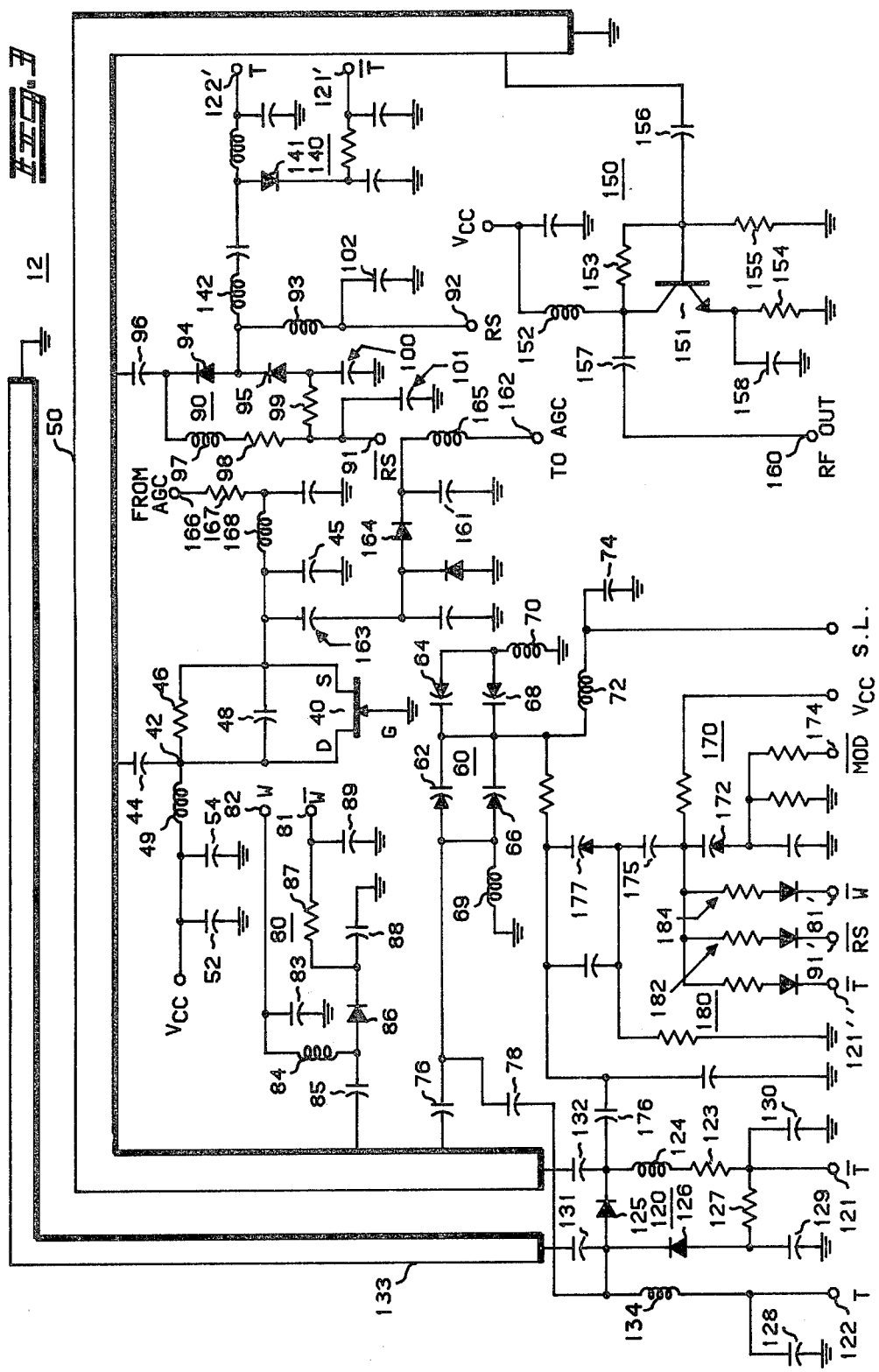

WIDEBAND, SYNTHESIZER SWITCHED ELEMENT VOLTAGE CONTROLLED OSCILLATOR

BACKGROUND OF THE INVENTION

The present invention relates generally to voltage controlled oscillators and, more particularly, to an improved switched element voltage controlled oscillator with an exceptionally wide synthesizer-controlled bandwidth wherein no field tuning is required.

Until recent years, radio transceivers exhibited relatively narrow bandwidths. This was because the frequency determining means was a channel element which inter alia, customarily included a piezoelectric crystal device. Of course several channel elements could be employed to selectively switch to a desired frequency among several. However, the total bandwidth encompassing the plurality of frequencies was not great. In some instances, it was not uncommon that the two frequencies of interest were sufficiently far apart that even though in the same frequency band, i.e. VHF band, for example, a separate and additional radio unit was required to accommodate both frequencies. Such was so even though channel elements were available that could otherwise cover the two frequencies of interest. The filtering required to eliminate harmonic components simply could not be effected.

With the advent of synthesizers, however, channel elements were no longer required, and a significantly wide bandwidth could then be effected. Moreover, any frequency in the entire range was accessible rather than one or two discrete frequencies as determined by the crystal devices. Nevertheless, very wide bandwidths, on the order of 50 megahertz, was not and is not, until now, possible, given the restraints of no substantial degradation in performance specifications, such as, inter alia, sideband noise and modulation capabilities over the designated bandwidth.

It is of course known in the art to employ frequency shift networks in conjunction with voltage control oscillators to shift the operating frequency over a designated range. However, when frequency determining elements are simply switched in, without more tank circuit sensitivity of the oscillator, sideband noise may increase and, in the case of inductive reactance being switched in by, say for example, pin diodes, higher supply line noise modulation sensitivity may occur, as well as possible parasitic oscillation modes.

SUMMARY OF THE INVENTION

Accordingly, it is an object of the present invention to provide an improved switched element voltage control oscillator with exceptionally wide synthesizer controlled bandwidth which effectively overcomes the foregoing deficiencies.

It is a specific object of the present invention to provide an improved wideband voltage control oscillator of the foregoing type having a novel binary series of frequency switching networks which successfully avoid the degrading modulation sensitivity or increasing sideband noise.

Another object of the present invention is to provide an improved wideband voltage control oscillator of the foregoing type having frequency switching networks which minimize any changes in oscillator tank sensitivity and susceptibility to parasitic oscillation modes.

In practicing the invention, a wideband switched element voltage controlled oscillator is provided which includes a tank circuit formed by a capacitance and a microstrip inductor. The frequency of the tank circuit, and in turn, the operating frequency of the oscillator as a whole, may be selectively controlled within a relatively narrow band of frequencies, say on the order of 6 MHz, by at least one varactor element coupled to the oscillator tank circuit. In addition, a plurality of pin diode frequency shift networks are provided which when selectively switched into the tank circuit shifts the frequency of the oscillator in selectable binary steps over a relatively wide frequency range. In one embodiment, the discrete frequency shifts may be on the order of 6 MHz, 12 MHz and 24 MHz, respectively. Accordingly, the binary frequency shift networks in conjunction with the varactor frequency shift element or elements permit the selection of an operating frequency anywhere within a range of approximately 48 MHz. In addition, the voltage control oscillator of the present invention also includes an arrangement to prevent undesirable parasitic oscillation modes when the binary frequency shift networks are in the switched off, inactuated mode.

BRIEF DESCRIPTION OF THE DRAWINGS

The features of this invention, which are believed to be novel, are set forth with particularity in the appended claims. The invention itself, however, together with further objects and advantages thereof, may be best understood when taken in conjunction with the accompanying drawings in which:

FIG. 3 is a schematic diagram of the voltage controlled oscillator of FIG. 1.

DESCRIPTION OF THE PREFERRED EMBODIMENT

Figure 1:
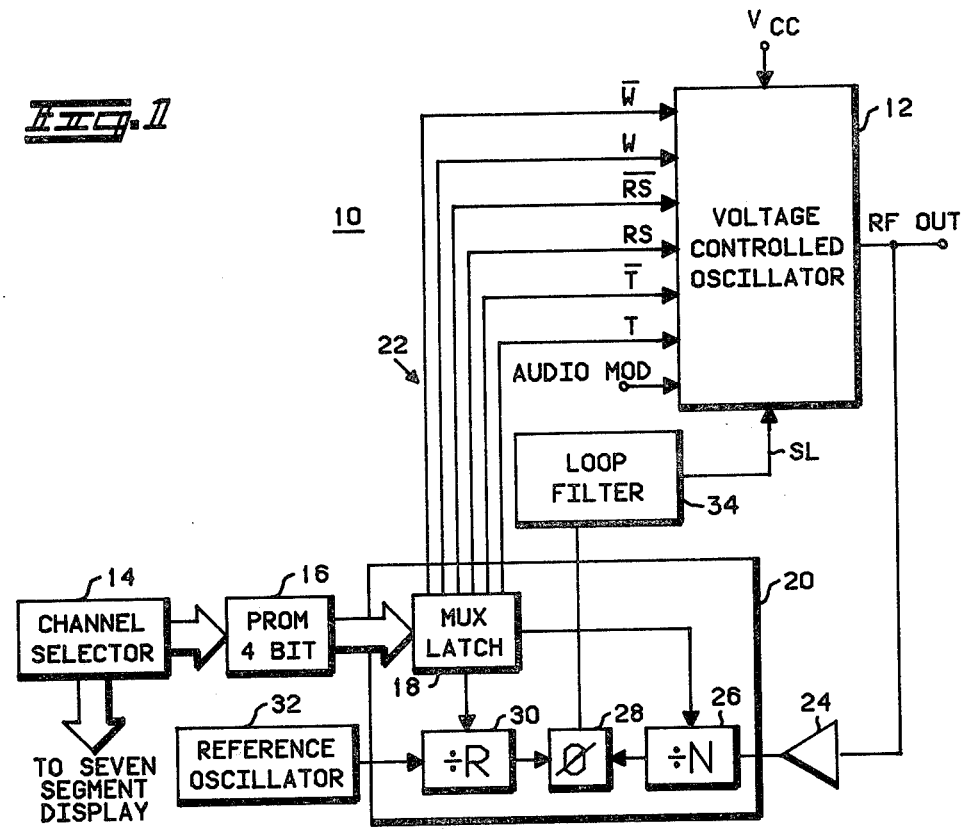
FIG. 1 is a block diagram of a portion of a front end of a radio transceiver which includes a voltage controlled oscillator which has been constructed in accordance with the present invention.

Referring now to the drawings, a portion of a front end of a radio transceiver is shown at 10, which includes a voltage controlled oscillator 12 constructed in accordance with the present invention. The transceiver 10 includes a channel selector 14 which is coupled to a four-bit PROM 16 and also to a conventional seven-segment display (not shown) to display the channel selected by the channel selector 14. Selector 14 may be of any suitable type, such as the binary coded cam selector switch described in U.S. Pat. No. 4,071,720, and assigned to the same assignee as the present invention.

The output of the PROM 16 is coupled to a multiplex latch 18 included in an IC circuit 20. Latch 18 provides the correct DC signal and switching line pair of a six-line pair 22 feeding the VCO 12. Each of the line pairs, designated $\overline{RS}$, RS, $\overline{W}$, W and $\overline{T}$, T, when actuated, will effect a discrete frequency shift or step of a predetermined amount in the VCO 12, as will be explained subsequently. The RF output of the VCO 12 is coupled through a buffer amplifier 24 and from there to a divide by N circuit 26 included in the IC 20, and from there to a phase detector circuit 28. The phase detector 28 also includes a second input which is coupled to the output of a divide by R circuit 30. Divide by R circuit 30 receives a signal from a reference oscillator 32 and also from the multiplex latch 18. The output of the phase detector feeds a loop filter 34, in the conventional manner, which in turn, provides a DC voltage over a steering line (SL) coupled to the VCO 12. The DC voltage on the steering line (SL) effects a frequency shift within a predetermined narrow band of frequencies as will be explained subsequently.

Figure 2:
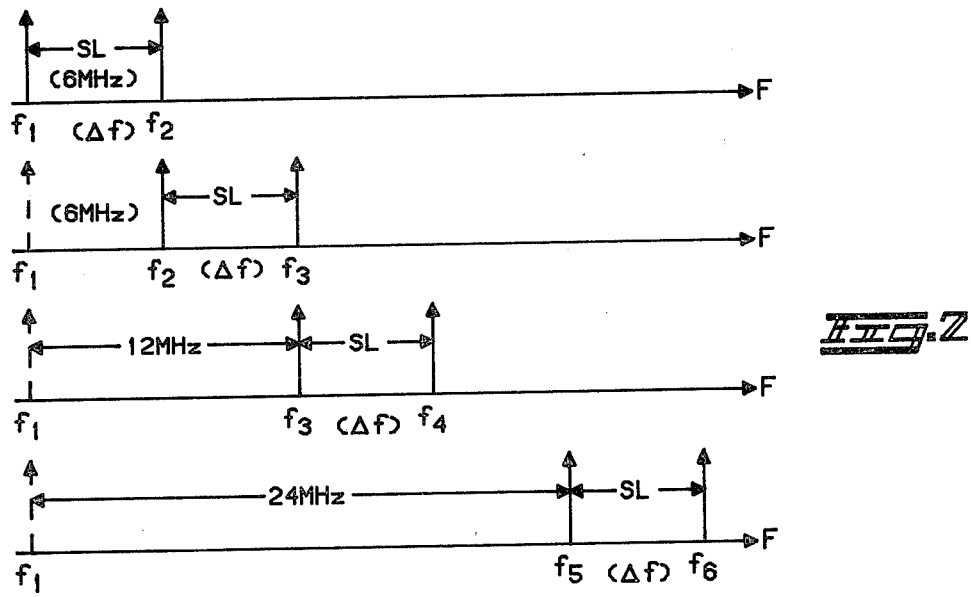
FIG. 2 is a graphic illustration of frequency shifts obtainable by the present invention.

As depicted in FIG. 2, the DC voltage generated on steering line SL and applied to VCO 12 is capable of providing a given frequency within the range of $F_1$ and $F_2$, indicated here for example as approximately 6 MHz. This may be defined as the steering range and is indicated as $\Delta F$. By activating one pair of switch lines, say for example, $\overline{W}$ and W, a discrete frequency step of $\Delta F$, or about 6 MHz, may be effected. The steering line SL is now able to effect any frequency within an additional 6 MHz, or up to $F_3$, as depicted. Upon activating another pair of switch lines, say for example, $\overline{RS}$ and RS, the VCO 12 may be caused to shift in frequency approximately to $\Delta F$, or about 12 MHz. Activating the remaining switching lines may effect a shift in frequency of $4\Delta F$, or about 24 MHz. Activating all three pairs of switching lines together would effect a frequency shift of $7\Delta F$, or about 42 MHz (6 MHz, 12 MHz and 24 MHz). An additional 6 MHz in frequency may be added to that by appropriate voltage applied over the steering line SL.

Referring now to FIG. 3, the voltage controlled oscillator 12 is shown in schematic detail. Oscillator 12 is basically a Jfet grounded gate oscillator using a microstrip transmission line resonator 50. Jfet transistor 40 is shown as having its gate G connected to ground, its drain electrode D coupled to a junction terminal 42 and from there to the microstrip transmission line 50 through an RF short, DC blocking capacitor 44. The source electrode S is also connected to terminal 42 through a parallel resistance 46 and capacitance 48. A further capacitance 45 is connected from source electrode S to ground. A voltage source Vcc is applied to terminal 42 through an RF choke 49. Capacitors 52 and 54 serve as bypass capacitors to ground. Microstrip inductance 50 in conjunction with capacitance 48 and capacitance 45 forms a tank circuit in the conventional sense. VCO 12 operates within some predetermined range of frequencies, say for example, between 124 and 174 MHz.

As shown, a varactor tuning circuit 60 is provided which includes a plurality of varactor elements, 62, 64, 66, and 68 connected in a series-parallel arrangement in the manner illustrated. RF chokes 69 and 70 are connected from respective end terminals thereof to ground. A DC voltage is applied over steering line SL to the common center junction of network 60 through RF choke 72. Capacitor 74 serves as an RF bypass to ground. Varactor tuning network 60 is coupled to the microstrip inductance 50 through a coupling capacitor 76. Changing the DC voltage level, say between three volts and eight volts, on the steering line SL to the network 60 changes the capacitance of the respective diodes 62, 64, 66 and 68 so as to change the tank circuit 45, 48, 50, and in turn VCO 12, over a predetermined narrow range of frequencies on the order of 6.2 MHz.

In addition to the varactor tuning network 60 for shifting the VCO 12 to any particular frequency within an approximate 6 MHz band, additional switching networks 80, 90 and 120 are included for shifting the frequency of the VCO in discrete binary steps over a much wider frequency range, say on the order of 48 MHz.

Switching network 80, when activated, changes the frequency of the VCO 12, by approximately 6 MHz, while network 90, when actuated, shifts the frequency approximately 12 MHz, and network 120 shifts the frequency by approximately 24 MHz. Networks 80, 90 and 120 may be selectively actuated or in combination with one another. All three networks, when actuated simultaneously, provide a frequency shift of some 42 MHz, which in combination with the varactor tuning network 60, effects a maximum frequency shift for the oscillator 12 of at least 48 MHz.

Switching circuit 80 includes a pair of terminals 81 and 82. A capacitor 83 is connected from terminal 82 to ground and an inductance 84 acting as an RF choke is connected to the junction of a coupling capacitor 85 and the anode of a pin diode 86 whose cathode is connected through a series resistance 87 to terminal 81. Capacitor 83, and the further capacitors 88 and 89 serve as RF bypasses. Coupling capacitor 85 is then connected to the microstrip inductance 50 in the manner indicated. Pin diode 86 serving as an RF switch is switched on by a positive voltage being applied to terminal 82 (high) while terminal 81 remains less positive (low). Switching in capacitor 85 as indicated adds a negative reactive impedance across the main line inductance 50 which generates a frequency shift of approximately 6 MHz in the voltage controlled oscillator 12.

Switching network 90 includes terminals 91 ($\overline{RS}$) and 92 (RS). An inductance 93 is connected from the terminal 92 to the junction of a pair of pin diodes 94 and 95. The cathode of diode 94 is coupled to the main line inductance 50 through a coupling capacitor 96. The junction of capacitor 96 and diode 94 is connected through an RF choke 97 and a series resistance 98 to terminal 91. The anode of diode 95 is coupled through a resistor 99 to terminal 91. Capacitor 100 serves as an RF bypass, as do capacitors 101 and 102. Switching on diode 94 by a positive or high going voltage connects the positive inductance of inductor 93 in parallel with the main line inductance 50 such that a discrete frequency shift of approximately 12 MHz is realized in the operating frequency of the voltage controlled oscillator 12.

Switching network 120 includes terminals 121 (T) and 122 (T). A series resistance 123 and an inductance 124, acting as an RF choke, are connected between terminal 121 and the cathode of a pin diode 125. The anode of pin diode 125 is connected to terminal 122 through RF choke 134 and to the cathode of a pin diode 126, whose anode is connected to terminal 121 through a resistance 127. Capacitors 128, 129 and 130 serve as RF bypass capacitors. Capacitors 131 and 132 are coupling capacitors. Upon applying a positive or high going voltage to forward bias pin diode 125, the additional microstrip inductance 133 is connected in parallel with the main microstrip inductance 50. Inductance 133 is such that when operatively connected to the VCO 12, a frequency shift therein of approximately 24 MHz is realized. Capacitor 78 provides steering line compensation for this 24 MHz shift.

It will be noted that in applying turn on voltage to diode 125 via terminals 121 and 122, the same is applied to terminals 121' and 122' as well, which turns on a pin diode 141, as shown. The turn on of diode 141 results in an additional inductance 142 being essentially placed in parallel with inductance 93. This added inductance is necessary to ensure that the frequency shift network 90 shifts the frequency a full 12 MHz when frequency shift network 120 is likewise activated at the same time. When network 120 is activated, the addition of inductance 133 in parallel with the inductance 50 renders the tank circuit of the VCO 12 less sensitive and an additional amount of inductance is required to then shift the VCO another 12 MHz upon activation of network 90. This additional inductance represented by inductor 142 is not needed when switching network 120 is activated by itself.

A buffer amplifier circuit 150 is provided having a transistor 151. Elements 152, 153, 154 and 155 form a conventional biasing network. Capacitors 156 and 157 are coupling capacitors and capacitors 158 serves as an RF bypass capacitor. Terminal 160 thus forms the output of the voltage controlled oscillator 12.

Provision for automatic gain control is effected by feeding portion of the signal of the Jfet transistor 40 at the source electrode S through capacitor 163, rectifying this RF signal in diode 164 and charging up capacitor 161. This DC voltage which is proportional to the RF level in the oscillator tank is fed through choke 165 to terminal 162 which is connected to a conventional AGC circuit (not shown) located elsewhere. The appropriate DC bias voltage is applied to terminal 166, and from there back to the Jfet transistor 40 through a series resistor 167 and RF choke 168. The RF voltage level of oscillator transistor 40 is set as high as possible without causing rectification in the pin diodes, varactors of fet junctions in the oscillator itself. The wide band operation of the present VCO 12 causes significant gain variations, making a control loop that can provide constant tank level very important in optimizing side band noise.

It will be appreciated that, without more, the VCO 12 as described up to this juncture, is suitable only for receiver applications. Accordingly, to make the disclosed oscillator arrangement suitable for transmitter applications as well, some means of modulating the oscillator frequency must be effected. Such provision is made by the modulator circuit 170 which includes a modulation varactor 172 for direct frequency modulation of the oscillator 12 over its operating frequency range. Audio modulation is applied to modulation terminal 174 and from there to the anode of the varactor 172. The applied modulation voltage changes the capacity of varactor 172 which is applied to the main line inductance 50 through coupling capacitors 175, 176 and 132 as well as an additional coupling varactor 177. Varactor 177 is biased at the steering line voltage, as shown, to effectively compensate for decreases in tank sensitivity as the steering line capacity increases with lower voltages. The increase in modulation varactor coupling offsets the tank circuit sensitivity reduction. Pin diode switch bias lines 180, 182 and 184 are also provided which includes terminals 81', 91' and 121" common to terminals 81, 91 and 121. Switching networks 80, 90 and/or 120 also adjusts the bias to the modulation varactor 172 via the appropriate bias line 180, 182 or 184. Increasing the bias of the modulation varactor 172 lowers the modulation sensitivity. Stability is achieved by the proper adjustment of the network resistances of bias lines 180, 182 and 184 to produce proper bias changes. A more detailed operational description of a modulator circuit similar to that as shown at 170 where desired may be obtained by reference to a co-pending application, Ser. No. 249,532, filed even date herewith on behalf of Terrance J. Goedken and James K. Gehrke and assigned to the same assignee as the present invention.

It will also be appreciated that with switch networks 90 and 120 in the "off" mode, a problem of potential parasitic oscillation exists for oscillator 12. For example, pin diode 94 in network 90 has a junction capacity in the off mode which is capable of resonating with the inductance 93 to cause undesirable parasitic oscillation in oscillator 12 as well as higher supply line noise modulation sensitivity. The same is true in network 120 with repect to pin diode 125. However, such undesirable spurious modes are effectively prevented in the present invention by the provision of an additional shunt diode across the positive reactance to prevent this undesirable resonance. Diode 95 provides this function in network 90 with diode 126 providing the same for network 120. When diodes 94 and 125 are in the "off" mode, associated diodes 95 and 126 are in the "on" mode so as to bring down the connecting end of inductance 93 or 133 to near ground level which prevents the parasitic oscillation from occurring. Switch network 80 needs no additional shunt diode since it adds a capacitive, negative, reactance to the oscillator tank circuit instead of an inductive, or positive, reactance.

Accordingly, a novel wide band voltage controlled oscillator has been disclosed herein which is capable of operating effectively and efficiently over a wide frequency range, say on the order of 48 MHz in the high VHF band. A unique binary series of pin diode frequency switch networks are provided, which in conjunction with a varactor switch circuit, permits the selection of any desired frequency over the operating range of the oscillator. Appropriate ones of the switch networks include a provision to prevent undesirable parasitic oscillation modes in the oscillator when such networks are in the inactuated, switched off condition.

What is claimed is:

1. A wideband switched element voltage controlled oscillator, including in combination:
    oscillator means including capacitive and inductive elements forming a tank circuit;
    means including at least one varactor tuning element coupled to said tank circuit for changing the frequency of said oscillator means within a predetermined band of frequencies;
    a plurality of pin diode frequency shift networks selectively switchable into said tank circuit for changing the frequency of said oscillator means in selectable discrete binary steps over a range of frequencies substantially greater than said predetermined band of frequencies; and
    means to prevent parasitic oscillation modes in said oscillator means when said binary frequency shift networks are in a switched off, inactuated mode.

2. A wideband switched element, voltage controlled oscillator in accordance with claim 1 wherein first, second and third pin diode frequency shift networks are included for shifting the operating frequency of said oscillator in approximate 6 MHz, 12 MHz and 24 MHz steps.

3. A wideband switched element, voltage controlled oscillator in accordance with claim 2 wherein the first frequency shift network when actuated couples a capacitive reactance into said tank circuit of said oscillator means while said second and third frequency shift networks when actuated couple an inductive reactance into said tank circuit.

4. A wideband switched element, voltage controlled oscillator in accordance with claim 3 wherein said third frequency shift network includes a microstrip inductance for coupling to said tank circuit.

5. A wideband switched element, voltage controlled oscillator in accordance with claim 1 wherein said varactor tuning means includes a first pair of series connected varactor diodes in parallel with a second pair of series connected varactor diodes, said varactor diodes having common cathodes fed by a variable steering line voltage.

6. A wideband switched element, voltage controlled oscillator in accordance with claim 1 wherein said frequency shift networks include a first pin diode which when switched on couples in a reactance to said oscillator tank circuit to change the operating frequency thereof and wherein said means for preventing parasitic oscillation modes includes an additional pin diode in said frequency shift networks which couples said switched reactance to a reference potential when said first pin diode is in a switched off mode.

7. A wideband switched element, voltage controlled oscillator in accordance with claim 1 wherein said plurality of frequency shift networks includes at least first and second such networks for selectively coupling an inductive reactance into said tank circuit for changing the frequency of said oscillator means wherein said first network further includes means for altering said switched inductance when said first network is activated in combination with the activation of said second network.

8. A wideband switched element, voltage controlled oscillator in accordance with claim 1 wherein said oscillator means includes a Jfet grounded gate transistor device.

9. A wideband switched element voltage controlled oscillator in accordance with claim 1, wherein said inductive element forming a portion of said tank circuit is a microstrip inductance.

10. A wideband switched element, voltage controlled oscillator, including in combination:
 oscillator means including capacitive and inductive elements forming a tank circuit;
 means including at least one varactor tuning element coupled to said tank circuit for changing the frequency of said oscillator means within a predetermined band of frequencies;
 a plurality of pin diode frequency shift networks selectively switchable into said tank circuit for changing the frequency of said oscillator means in selectable discrete binary steps over a range of frequencies substantially greater than said predetermined band of frequencies;
 means to prevent parasitic oscillation modes in said oscillator means when said binary frequency shift networks are in a switched off, inactuated mode;
 means for automatically controlling the gain of said oscillator means at a high RF output level without causing rectification in the junctions of said varactor and pin diodes; and
 buffer amplifier means coupled to said tank circuit and providing an output for said oscillator means.

* * * * *